US006621762B1

(12) United States Patent
Roohparvar

(10) Patent No.: US 6,621,762 B1
(45) Date of Patent: Sep. 16, 2003

(54) NON-VOLATILE DELAY REGISTER

(75) Inventor: Frankie Fariborz Roohparvar, Milpitas, CA (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 10/159,152

(22) Filed: May 29, 2002

(51) Int. Cl.$^7$ ............................... G11C 8/00; H03L 7/06
(52) U.S. Cl. ...................... 365/233; 365/194; 327/156; 327/158
(58) Field of Search ............................. 365/194, 189.12, 365/233; 327/156, 158, 161, 299

(56) References Cited

U.S. PATENT DOCUMENTS

| 5,964,880 | A | | 10/1999 | Liu et al. |
|---|---|---|---|---|
| 6,125,157 | A | * | 9/2000 | Donnelly et al. ........... 375/371 |
| 6,300,807 | B1 | | 10/2001 | Miyazaki et al. |
| 6,373,308 | B1 | | 4/2002 | Nguyen |
| 6,385,126 | B2 | | 5/2002 | Jung et al. |
| 6,400,197 | B2 | * | 6/2002 | Lai et al. ..................... 327/161 |
| 6,437,618 | B2 | * | 8/2002 | Lee ............................ 327/158 |

* cited by examiner

*Primary Examiner*—Son Mai
(74) *Attorney, Agent, or Firm*—Leffert Jay & Polglaze, P.A.

(57) ABSTRACT

An integrated circuit includes a delay lock circuit to synchronize an internal clock signal with an external clock. The integrated circuit, in one embodiment, is a memory device. The delay lock circuit includes a delay line, a delay register to control a delay time of the delay line, and a non-volatile register. The non-volatile register stores an initial value for the delay register. The delay register is pre-loaded with the contents of the non-volatile register to decrease the time need to synchronize the clock signals.

22 Claims, 2 Drawing Sheets

NON-VOLATILE DELAY REGISTER

FIELD OF THE INVENTION

The present invention relates generally to delay lock circuits and in particular the present invention relates to integrated circuits with a non-volatile delay register.

BACKGROUND OF THE INVENTION

As the level of integration of digital integrated circuits increases, the generation and distribution of internal clock signals becomes more problematic. For example, distributing synchronous clock signals to many registers (ed.g. thousands) throughout a very large scale integrated circuit can introduce significant clock skewing due to the parasitic resistive and capacitive loading of the clock signal lines.

One technique for minimizing clock skewing due to mass distribution of a synchronous clock signal is to use a phase lock loop (PLL) whereby a reference clock signal is distributed and used to generate and synchronize many local clock signals. The PLL can also be used to multiply the frequency of the reference clock signal thereby generating local clock signals which are synchronous frequency multiples of the reference clock signal.

Implementing a PLL in a typical digital integrated circuit is undesirable since the typical PLL requires the use of analog circuits, such as a voltage controlled oscillator, phase detector, charge pump, and low pass filter.

Other types of locking loops have been commonly used for generating timing reference signals used in electronic circuits. One example of such a locking loop is a delay lock loop or digital delay lock loop. The operation of exemplary locking circuitry or delay lock loops is described in the following patents, the disclosures of which are incorporated by reference: U.S. Pat. Nos. 6,150,856, 5,663,665, 5,771,264, 5,642,082, and 5,744,991. Each of these delay lock circuitry architectures requires an iterative synchronization, or lock, operation. This lock operation is typically performed during a power-up operation and must be performed prior to operating the integrated circuit incorporating the delay lock circuit.

For reasons stated below which will become apparent to those skilled in the art upon reading and understanding the present specification, there is a need in the art for a delay lock circuit with a reduced synchronize time.

SUMMARY OF THE INVENTION

The above-mentioned problems with delay lock circuits and other problems are addressed by the present invention and will be understood by reading and studying the following specification.

In one embodiment, an integrated circuit comprises a clock connection to receive an external clock signal, a delay circuit coupled to the clock connection to provide a delay output clock signal on an output connection, and a phase detector coupled to the clock connection and the output connection of the delay circuit. The phase detector determines a timing difference between the external clock signal and the delay output clock signal. A delay register is coupled to the delay circuit. A data content of the delay register adjusts a delay time of the delay circuit, and a non-volatile register is coupled to load the delay register with initial start data.

In another embodiment, a synchronous memory device comprises a clock connection to receive an external clock signal, a delay circuit coupled to the clock connection to provide a delay output clock signal on an output connection, and a delay register coupled to the delay circuit. A data content of the delay register adjusts a delay time of the delay circuit. A non-volatile register is coupled to load the delay register with initial start data.

A method of operating a delay circuit comprises initiating a clock synchronization operation to synchronize an output signal of the delay circuit with a clock signal, loading a volatile register with initial start data stored in a non-volatile register, and adjusting the volatile register to control a delay time of the delay circuit.

A method of operating a memory device comprises synchronizing an internal clock signal with an external clock signal using a delay lock circuit. The delay lock circuit comprises a delay register. A contents of the delay register is copied to a non-volatile register after the internal clock signal is synchronized with the external clock signal.

DETAILED DESCRIPTION OF THE DRAWINGS

In the following detailed description of the preferred embodiments, reference is made to the accompanying drawings, which form a part hereof, and in which is shown by way of illustration specific preferred embodiments in which the inventions may be practiced. These embodiments are described in sufficient detail to enable those skilled in the art to practice the invention, and it is to be understood that other embodiments may be utilized and that logical, mechanical and electrical changes may be made without departing from the spirit and scope of the present invention. The following detailed description is, therefore, not to be taken in a limiting sense, and the scope of the present invention is defined only by the claims.

As the speeds of memories get faster the need for signal synchronization is becoming very critical. Most high-speed DRAM memories are use Delay Lock Loop circuitry (DLL) to synchronize an internal clock signal with an externally provided clock. The present invention is not limited to a specific memory or integrated circuit. Specifically, the invention can be embodied in a volatile or non-volatile memory or other integrated circuit where clock synchronization is important. To better understand one embodiment of the present invention, a non-volatile synchronous memory is described.

Figure 1:
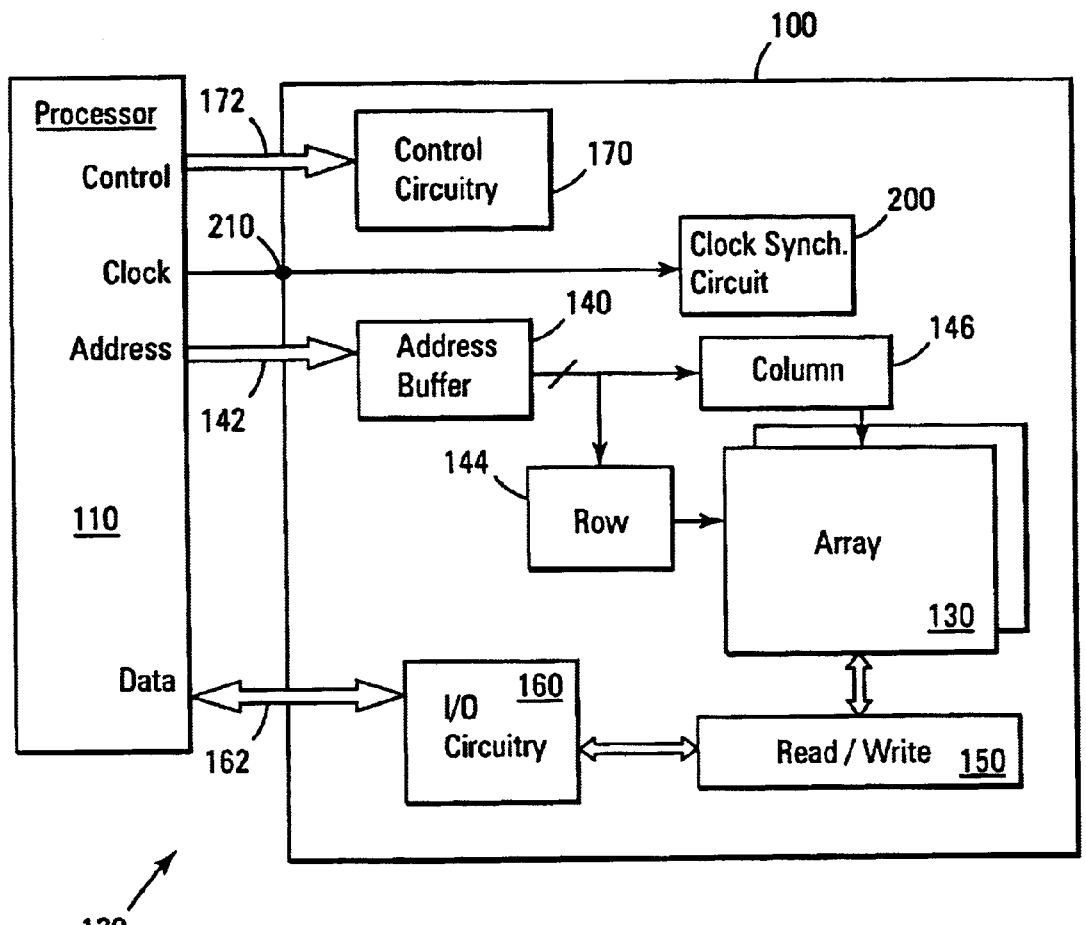
FIG. 1 is a block diagram of a memory device of one embodiment of the present invention.

FIG. 1 is a functional block diagram of a memory device 100, of one embodiment of the present invention, that is coupled to a processor 110. The memory device 100 and the processor 110 form part of an electronic system 120. The memory device 100 has been simplified to focus on features of the memory that are helpful in understanding the present invention. The memory device includes an array of memory cells 130. The memory cells are preferably non-volatile floating-gate memory cells and generally have their control gates coupled to word lines, drain regions coupled to local bit lines, and source regions commonly coupled to a ground potential. The memory array 130 is arranged in banks of rows and columns. Each bank is arranged in erase blocks. During an erase operation, the memory cells of the erase block are placed in an erased state. Data, however, may be stored in the memory array 130 separate from the block structure.

An address buffer circuit 140 is provided to latch address signals provided on address input connections A0-Ax 142. Address signals are received and decoded by row decoder 144 and a column decoder 146 to access the memory array 130. It will be appreciated by those skilled in the art, with the benefit of the present description, that the number of address input connections depend upon the density and architecture of the memory array. That is, the number of addresses increases with both increased memory cell counts and increased bank and block counts.

The non-volatile memory cells are fabricated as floating gate memory cells and include a source region and a drain region that is spaced apart from the source region to form an intermediate channel region. A floating gate, typically made of doped polysilicon, is disposed over the channel region and is electrically isolated from the other cell elements by oxide. For example, gate oxide can be formed between the floating gate and the channel region. A control gate is located over the floating gate and can also be made of doped polysilicon. The control gate is electrically separated from the floating gate by another dielectric layer. Thus, the floating gate is "floating" in dielectric so that it is insulated from both the channel and the control gate.

The program and erase operations are not performed in single steps. That is, successive program pulses are applied to the memory cells to program a memory cell. This approach reduces over-programming. In a similar manner, the erase operation is iterative. In one embodiment, the erase operation includes three primary steps. The first is a pre-program operation in which all of the memory cells of an erase block are programmed. After all of the cells are pre-programmed, successive erase pulses are applied to the memory cells to remove the pre-program charge from the floating gate. A soft-program operation can be performed to 'heal' any over-erased memory cells.

The memory device reads data in the array 130 by sensing voltage changes in the memory array columns using read/write circuitry 150. The sensing circuitry, in one embodiment, is coupled to read and latch a row of data from the memory array.

Data input and output buffer circuitry 160 is included for bidirectional data communication over a plurality of data (DQ) connections 162 with the processor 110. The timing of data communication can vary depending upon the architecture. In one embodiment, data read from the memory can be output on the data connections with read latency. Read latency, as known to those skilled in the art, is the number of clock cycles between a read command and available data on the output connections. In addition, the memory can operate in a burst mode and allows read-while-write capabilities to different array banks.

Command control circuit 170 decodes signals provided on control connections 172 from the processor 110. These signals are used to control the operations on the memory array 130, including data read, data write, and erase operations. During operation, commands are provided on the control connections, such as ACTIVE, READ and WRITE commands. An ACTIVE command is used to open (or activate) a row in a particular array bank for a subsequent access. A selected row generally remains active for accesses until the next ACTIVE command. The READ command is used to initiate a read access to an active row. The address connections are used to select a starting column location. Read data appears on the DQs subject to a read latency value. A WRITE command is used to initiate a single-location write access on an active row. Input data appearing on the DQs is written to the memory array.

The flash memory device has been simplified to facilitate a basic understanding of the features of the memory. A more detailed understanding of internal circuitry and functions of flash memories are known to those skilled in the art.

Figure 2:
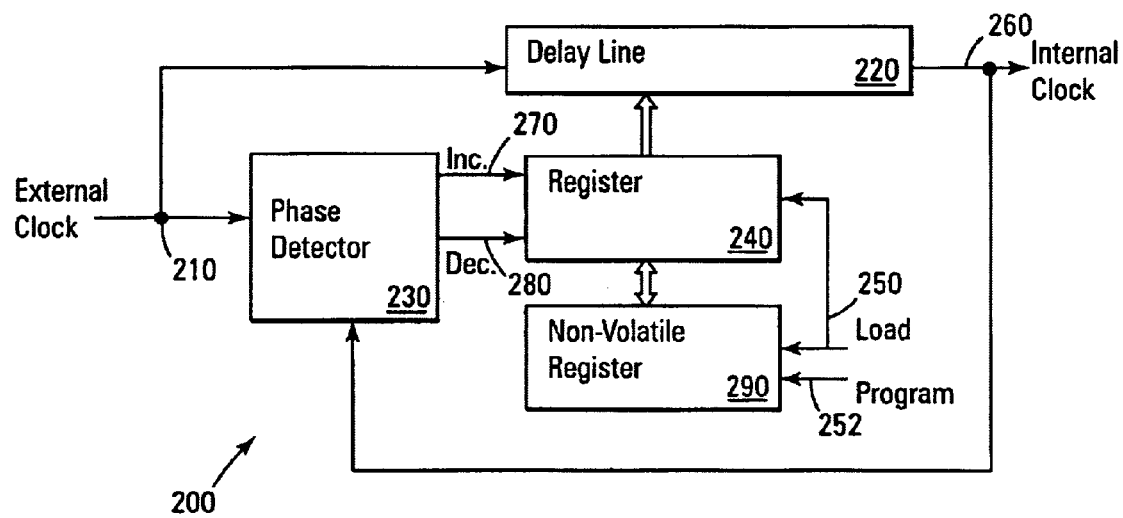
FIG. 2 is a block diagram of a delay lock circuit of an embodiment of the present invention.

The memory device of FIG. 1 also includes a clock input connection to receive an externally provided clock signal. A clock synchronization circuit 200 is provided in the memory to synchronize an internal clock signal with the external clock 210. A more detailed description of the clock synchronization circuit is provided with reference to FIG. 2. The clock synchronization circuit 200, or delay lock circuit, of FIG. 2 has been simplified to focus on the present invention. It will be appreciated by those skilled in the art, with the benefit of the present description, that other components can be added to the delay lock circuit depending upon the specific needs of the integrated circuit without departing from the present invention. For example, U.S. Pat. Nos. 6,150,856, 5,663,665, 5,771,264, 5,642,082, and 5,744,991 teach different delay lock circuits.

The delay lock circuit 200 includes a delay line 220, a phase detector 230 and a delay register 240. Upon each edge of the external clock 210, the phase detector compares the external clock to an internal clock signal output 260 from the delay line. The phase detector determines if a delay time of the internal delay line needs to be increased or decreased. In response to increment 270 and decrement 280 commands from the phase detector, the delay register changes the delay time of the delay line accordingly. This process is a repetitive process that requires a certain number of clocks to successfully synchronize the clock signals. For some clocks that run at 10's periods, this synchronizing process could take in the order of 10's to 100's of microseconds. The term 'delay register' refers to any circuit that stores control data to adjust the delay line. For example, it will be appreciated that the delay register can be a counter that stores a count value. The count value is incremented or decremented in response to the phase detector. Further, the delay register can be a storage register that is loaded with data from a counter, or similar circuit. As explained below, an initial start value, or data, for the delay register is stored in a non-volatile manner to speed synchronization of clock signals. The 'external clock' can be the directly provided on the memory input interface, or can be a clock signal provided by circuitry coupled to receive the memory clock input. The present invention is not limited to synchronizing directly to the input clock signal.

A non-volatile register 290 is provided in the integrated circuit of the present invention to maintain a start count for the delay register. The non-volatile register can include floating gate memory cells, or other similar non-volatile storage elements. The register can be programmed using an externally provided command(s) or automatically in response to an internally generated event.

In operation, the phase detector monitors the external clock and the internal clock signals. When the clock signals are not synchronized, the phase detector 230 increments or decrements the delay register 240 to adjust the delay line 220. As such, the internal clock signal propagation is either increased or decreased. The phase detector continues to adjust the delay register until the clock signals are sufficiently synchronized. When the clocks are synchronized, the circuit controller 170 (FIG. 1) programs the non-volatile register 290 with the contents of the delay register.

Because the clock signals are typically synchronized each time the device is turned on, or initialized, prior DLL register circuits begin this iterative process from a zero state (empty register). The present invention, however, allows the delay register 240 to be pre-loaded with the contents of the non-volatile register 290 prior to performing the synchronization operation. As such, the internal control circuitry 170 uses an externally provided load command from processor 110 to copy the non-volatile register contents to the delay register, such as during power-up operations. Control circuit 170 uses a load command 250 to copy the contents of the non-volatile register 290 to register 240, and a program command 252 to copy the contents of register 240 to register 290.

It will be appreciated by those skilled in the art that temperature or operating voltage variations can result in a small drift in the delay characteristics of the clock path. As such, a synchronization operation is still performed, but the circuit can lock the clock signals within a few cycles.

The present invention reduces a wait time due to synchronizing the clock signals and therefore allows faster access and operation of the device. In another embodiment of the present invention, the non-volatile register can be loaded with a 'typical' delay value prior to performing the first clock synchronization operation.

CONCLUSION

An integrated circuit has been described that includes a delay lock circuit to synchronize an internal clock signal with an external clock. The integrated circuit, in one embodiment, is a memory device. The delay lock circuit includes a delay line, a delay register to control a delay time of the delay line, and a non-volatile register. The non-volatile register stores an initial value for the delay register. The delay register is pre-loaded with the contents of the non-volatile register to decrease the time need to synchronize the clock signals.

Although specific embodiments have been illustrated and described herein, it will be appreciated by those of ordinary skill in the art that any arrangement, which is calculated to achieve the same purpose, may be substituted for the specific embodiment shown. This application is intended to cover any adaptations or variations of the present invention. Therefore, it is manifestly intended that this invention be limited only by the claims and the equivalents thereof.

What is claimed is:

1. An integrated circuit comprising:
   a clock connection to receive an external clock signal;
   a delay circuit coupled to the clock connection to provide a delay output clock signal on an output connection;
   a phase detector coupled to the clock connection and the output connection of the delay circuit, the phase detector determines a timing difference between the external clock signal and the delay output clock signal;
   a delay register coupled to the delay circuit, wherein a data content of the delay register adjusts a delay time of the delay circuit; and
   a non-volatile register coupled to load the delay register with initial start data.

2. The integrated circuit of claim 1 wherein the delay register is a counter circuit.

3. The integrated circuit of claim 1 wherein the non-volatile register copies a data value from the delay register in response to an external command.

4. The integrated circuit of claim 1 wherein the non-volatile register copies a data value from the delay register in response to an internal event trigger.

5. The integrated circuit of claim 1 wherein integrated circuit is a synchronous memory device.

6. A synchronous memory device comprising:
   a clock connection to receive an external clock signal;
   a delay circuit coupled to the clock connection to provide a delay output clock signal on an output connection;
   a phase detector coupled to the clock connection and the output connection of the delay circuit, the phase detector determines a timing difference between the external clock signal and the delay output clock signal;
   a delay register coupled to the delay circuit, wherein a data content of the delay register adjusts a delay time of the delay circuit; and
   a non-volatile register coupled to load the delay register with initial start data, wherein the non-volatile register is further coupled to store a data value copied from the delay register in response to an external command.

7. The synchronous memory device of claim 6 wherein the delay register is a counter circuit.

8. The synchronous memory device of claim 6 further comprises an array of non-volatile memory cells.

9. A synchronous memory device comprising:
   a clock connection to receive an external clock signal;
   a delay circuit coupled to the clock connection to provide a delay output clock signal on an output connection;
   a delay register coupled to the delay circuit, wherein a data content of the delay register adjusts a delay time of the delay circuit; and
   a non-volatile register coupled to load the delay register with initial start data.

10. The synchronous memory device of claim 9 wherein the non-volatile register is further coupled to store a data value copied from the delay register in response to an external command.

11. A method of operating a delay circuit comprising:
    initiating a clock synchronization operation to synchronize an output signal of the delay circuit with a clock signal;
    loading a volatile register with initial start data stored in a non-volatile register; and
    adjusting the volatile register to control a delay time of the delay circuit.

12. The method of claim 11 further comprises:
    comparing the output signal of the delay circuit with the clock signal; and
    incrementing or decrementing the initial start data in the volatile register in response to the comparison.

13. The method of claim 12 wherein the output signal of the delay circuit and the clock signal are compared using a phase detector circuit.

14. The method of claim 11 wherein the non-volatile register comprises floating gate memory cells.

15. A method of operating a memory device comprising:
    performing a power-up operation on the memory device;
    loading a delay register with initial start data stored in a non-volatile register; and
    synchronizing an internal clock signal with an external clock signal using a delay line circuit and the delay register.

16. The method of claim 15 wherein synchronizing the internal clock signal comprises:
    comparing the internal clock signal and the external clock signal; and
    adjusting the delay register to change a delay time of the delay circuit.

17. The method of claim 15 further comprises copying data from the delay register into the non-volatile register in response to an external command.

18. A method of operating a memory device comprising:
  synchronizing an internal clock signal with an external clock signal using a delay lock circuit, wherein the delay lock circuit comprises a delay register; and
  copying a contents of the delay register to a non-volatile register after the internal clock signal is synchronized with the external clock signal.

19. The method of claim 18 wherein the contents of the delay register are copied to the non-volatile register in response to an external command.

20. A method of performing an initialization operation of a synchronous flash memory device comprising:
  loading a delay register with initial start data stored in a non-volatile register; and
  beginning a synchronization operation of an internal clock signal using the initial start data.

21. The method of claim 20 wherein the synchronization operation adjusts a delay time of a delay line circuit using the delay register.

22. A synchronous flash memory device comprising:
  an array of non-volatile memory cells;
  a clock connection to receive an external clock signal;
  a delay circuit coupled to the clock connection to provide a delay output clock signal on an output connection;
  a phase detector to compare the external clock signal and the delay output clock signal;
  a delay register coupled to the delay circuit, wherein a data content of the delay register adjusts a delay time of the delay circuit; and
  a non-volatile register coupled to load the delay register with initial start data.

* * * * *